United States Patent
Honda et al.

(10) Patent No.: US 7,119,026 B2
(45) Date of Patent: Oct. 10, 2006

(54) BASIC MATERIAL FOR PATTERNING AND PATTERNING METHOD

(75) Inventors: Mitsuru Honda, Sakurai (JP); Takaya Nakabayashi, Iga (JP); Akiyoshi Fujii, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/525,614

(22) PCT Filed: Jun. 5, 2003

(86) PCT No.: PCT/JP03/07169

§ 371 (c)(1),
(2), (4) Date: Feb. 24, 2005

(87) PCT Pub. No.: WO2004/023540

PCT Pub. Date: Mar. 18, 2004

(65) Prior Publication Data
US 2005/0245079 A1    Nov. 3, 2005

(30) Foreign Application Priority Data
Aug. 30, 2002 (JP) ............................. 2002-255610

(51) Int. Cl.
*H01L 21/302* (2006.01)
*H01L 21/461* (2006.01)

(52) U.S. Cl. ...................... 438/748; 438/750
(58) Field of Classification Search ............ 438/748, 438/750, 752, 753, 754, 756, 757, FOR. 115
See application file for complete search history.

(56) References Cited

U.S. PATENT DOCUMENTS

| | | | | |
|---|---|---|---|---|
| 5,831,184 A | * | 11/1998 | Willard et al. | 73/864.91 |
| 5,914,052 A | * | 6/1999 | Derderian et al. | 216/83 |
| 6,042,219 A | * | 3/2000 | Higashino et al. | 347/47 |
| 6,092,537 A | * | 7/2000 | Kanno | 134/1.2 |
| 2002/0151161 A1 | * | 10/2002 | Furusawa | 438/597 |
| 2003/0059686 A1 | | 3/2003 | Kabayashi et al. | |

FOREIGN PATENT DOCUMENTS

| | | |
|---|---|---|
| EP | 0 930 641 A2 | 7/1999 |
| JP | 63-200041 | 8/1988 |
| JP | 11-274671 | 10/1999 |
| JP | 2000-249821 | 9/2000 |
| JP | 2002-164635 | 6/2002 |

(Continued)

*Primary Examiner*—Michelle Estrada
(74) *Attorney, Agent, or Firm*—George W. Neuner; David G. Conlin; Edwards Angell Palmer & Dodge LLP

(57) ABSTRACT

A pattern forming method of the present invention includes the steps of forming, on a substrate before droplets are ejected onto the substrate, a water repelling area, in which a contact angle between the droplet and the target surface is a first contact angle, and a water attracting line, which is adjacent to the water repelling area and in which a second contact angle is smaller than the first contact angle and which is to be the pattern to be formed; and landing droplets onto the target surface such that part of the droplet landed is in a water repelling area and part of the droplet landed is in a water attracting line, the equation (1) is satisfied, $$D \leq L \times \{1 + 2(\cos\theta_2 - \cos\theta_1)\} \quad (1)$$

where D is a droplet diameter, L is a pattern width, $\theta_1$ is a first contact angle, and $\theta_2$ is a second contact angle. By decreasing the number of discharged droplets, it is possible to prevent increase of a tact time and decrease of an inkjet operating life.

10 Claims, 8 Drawing Sheets

FOREIGN PATENT DOCUMENTS

| | | |
|---|---|---|
| WO | WO 01/46987 A2 | 6/2001 |
| WO | WO 01/47045 A1 | 6/2001 |
| WO | WO 2004/021447 | 3/2004 |
| WO | WO 2004/023541 | 3/2004 |
| WO | WO 2004/023561 | 3/2004 |

* cited by examiner

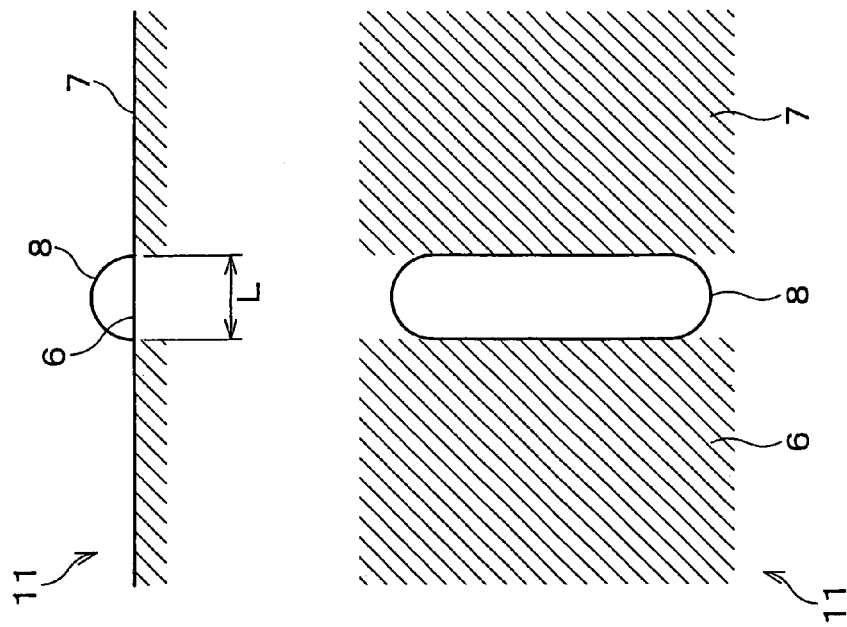
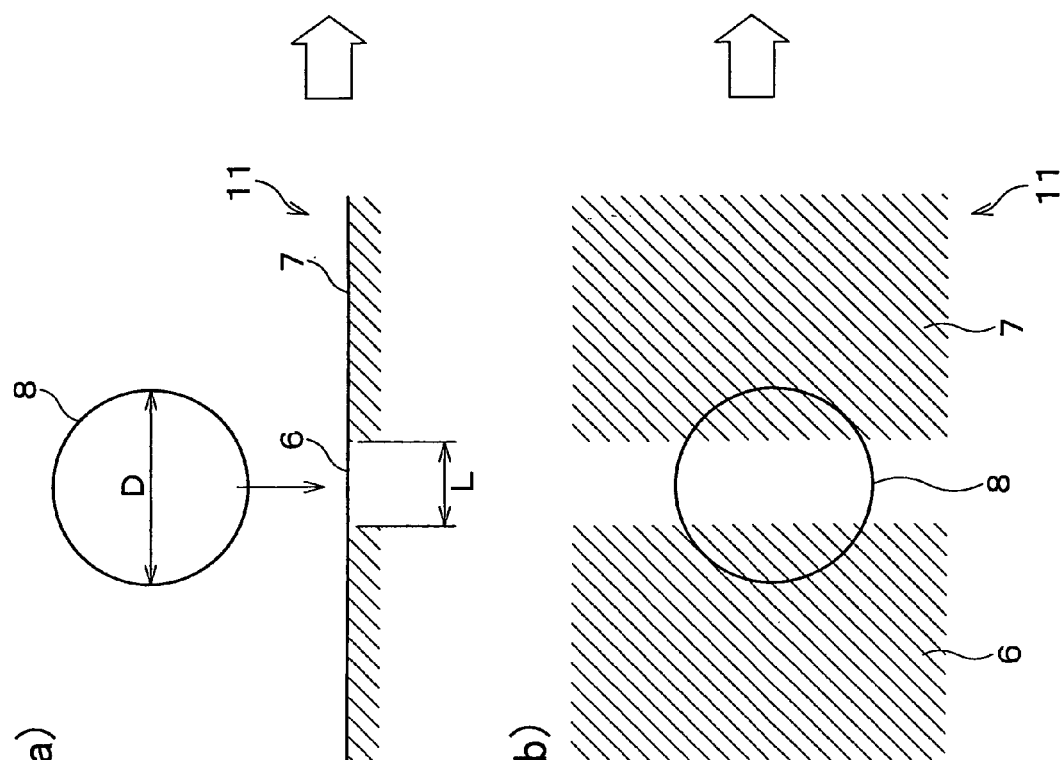
FIG. 1 (a)
FIG. 1 (b)

BASIC MATERIAL FOR PATTERNING AND PATTERNING METHOD

TECHNICAL FIELD

The present invention relates to a pattern formation substrate on which a predetermined pattern is formed by discharging droplets onto a target surface, and also relates to a pattern forming method.

BACKGROUND ART

In recent years, a wiring pattern of a substrate is formed by an inkjet technology. A wiring pattern can be directly formed on a substrate by the inkjet technology, so that high-cost processes, such as vacuum deposition, photolithography, etching, and resist removing process, can be omitted. As a result, a substrate can be produced at low costs.

Incidentally, when a wiring pattern is formed by using an inkjet head, fluid ink (droplets) containing a wiring material is jetted out and landed on a predetermined position on a substrate. When the droplets are discharged and landed on a substrate as above, there is a possibility that the droplets spread too much or come off due to the characteristics of a surface of the substrate. Therefore, there is a problem that a desired wiring pattern cannot be obtained.

In view of this, Japanese publication for Unexamined Patent Application Tokukaihei, No. 11-204529, (published on Jul. 30, 1999) discloses a method by which a desired wiring pattern can be formed while suppressing spreading or coming off of landed droplets as much as possible.

In the technology disclosed in the above publication, a surface of a substrate is modified beforehand so that an area, in which a wiring pattern may be provided, has affinity with droplets and the other area does not have the affinity. Then, the wiring pattern is formed by discharging droplets onto the affinity-having area (pattern forming area) on a substrate. In this case, the area except for the pattern forming area does not have affinity with droplets. Therefore, the droplets, which land on the pattern forming areas on a substrate, do not spread beyond the pattern forming areas.

Further, in the technology disclosed in the above publication, the droplets are discharged to be overlapped partially with each other on the pattern forming areas so that the landed droplets do not come off from the substrate. This prevents landed droplets from coming off.

However, in the pattern forming method disclosed in the above publication, the number of discharged droplets is large, because the wiring pattern is formed by discharging the droplets so that the droplets overlap partially with each other to prevent the landed droplets on a substrate from coming off. In such a case, there are problems that (i) a processing time (tact time) for a series of steps until forming the wiring patterns will increase due to an increase of the number of the droplets to discharge, and (ii) an operating life of an inkjet head will be shortened.

The present invention was made to solve the above problems, and an object of the present invention is to provide a pattern formation substrate and pattern forming method which attains a satisfactory wiring characteristics, while preventing an increase of a tact time and an operating life shortening of an inkjet head by decreasing the number of discharged droplets.

DISCLOSURE OF INVENTION

A pattern formation substrate of the present invention is so arranged that a predetermined pattern is formed by discharging droplets onto a target surface, and the pattern formation substrate is formed to fulfill the equation (1) below when part of the droplet lands on the first area and the other part of the droplet lands on the second area. A contact angle of the first area, when the above droplet lands on, is the first contact angle, and a contact angle of the second area, which lies adjacent to the first area, is the second contact angle which is smaller than the first contact angle:

$$D \leq L \times \{1 + 2(\cos\theta_2 - \cos\theta_1)\} \quad (1),$$

where D is a droplet diameter, L is a pattern width, $\theta_1$ is a first contact angle, and $\theta_2$ is a second contact angle.

According to the above arrangement, because the second contact angle is smaller than the first contact angle, the second area is more lyophilic than the first area. With this arrangement, when a droplet lands so that part of the droplet landed is on the first area and the other part is on the second area, the part of the droplet landed on the first area will move to the second area (pattern) which is more lyophilic than the first area.

Furthermore, by setting a droplet diameter, a wiring pattern width, the first contact angle, and the second contact angle so as to fulfill the equation (1), droplets will be gathered into the second area even if the droplet diameter is larger than the pattern width.

By arranging to use droplets, whose diameter is larger than a pattern width as such, the number of discharged droplets can be reduced compared with when droplets, whose diameter is equal to or smaller than a pattern width, is used.

By reducing the number of discharged droplets as above, it is possible to prevent an increase of a tact time and a shortening of an operating life of a droplet discharging mechanism, such as an inkjet head or the like device.

When wiring patterns are formed with droplets which contain wiring materials, each droplet does not overlap with each other on a substrate if the number of discharged droplets decreases. In this way, nonuniformity of wiring thickness, that is, nonuniformity of wiring resistance can be reduced. As a result, it is possible to obtain satisfactory wiring characteristics.

Further, it may be so arranged that the first contact angle is set so that the first area becomes a lyophobic area which is lyophobic against droplets, and the second contact angle is set so that the second area becomes a lyophilic area which is lyophilic to droplets.

In this case, the first area becomes a lyophobic area which is lyophobic against droplets and the second area becomes a lyophilic area which is lyophilic to droplets. Therefore, when a droplet lands so that part of the droplet landed is on the first area and the other part is on the second area, the droplet is repelled by the first area which is a lyophobic area, and the droplet spreads along the shape of the second area which is a lyophilic area is, the droplet, which is repelled by the first area, flows to the second area, and it spreads along the second area (pattern) together with droplets which land on the second area, and forms wirings.

Therefore, by arranging that an area that is not to be part of the pattern, that is, the first area, is lyophobic against droplets, it is possible to repel the landed droplets and to make droplets flow to the second area.

If the first area is a lyophobic area and the second area is a lyophilic area as described above, a difference between the first contact angle and the second contact angle becomes large, and the right side of the equation (1) becomes large. Here, the larger right side of the equation (1) indicates that it is possible to use droplets of a further larger droplet diameter in relation to a wiring pattern width.

Therefore, the number of discharging droplets can be further decreased by using the larger size of a droplet diameter in relation to a wiring pattern width. As a result, it becomes possible to decrease a tact time and prolong an operating life of a droplet discharging mechanism such as an inkjet head.

Moreover, a pattern forming method according to the present invention, in which a predetermined pattern is formed by discharging droplets onto a target surface, includes the steps of (i) forming a first area and a second area adjacent to the first area before the droplet is discharged, the first area being lyophobic against droplets, and the second area being lyophilic to droplets and being to be the pattern to be formed, and (ii) discharging the droplets onto the target surface so that a distance X satisfy the equation (2), the distance X being a distance from a border between the first and the second areas, to a center of a landed droplet.

$$X \le \sqrt[3]{\frac{4}{2 - 3\cos\theta_1 + \cos^3\theta_1}} \cdot \frac{D}{2} \quad (2)$$

where, X is a distance between a border of water attracting/water repelling patterns and a center of a landing droplet, D is a droplet diameter, and $\theta_1$ is a contact angle of ink in water repelling area.

In the above arrangement, droplets land onto a target surface so that the distance X, which is the distance between the border of water attracting/water repelling patterns and the center of landing droplet, can fulfill the equation (2). According to this arrangement, it is possible to move droplets, which land on the first area which is a lyophobic area, to the second area which is a lyophilic area. That is, it is possible to move droplets to the second area even if the center of the droplets is not on the second area.

With this arrangement, even when a low-precision droplet discharging mechanism such as an inkjet head is used to discharge droplets onto the substrate, droplets can surely be gathered to the second area that is to be formed as a pattern. Thus, it is possible to precisely form the pattern.

Therefore, it becomes possible to reduce the cost of an apparatus which is for forming a pattern.

Here, the droplet can move in a wider range when the droplet is larger as long as a pattern shape permits and a contact angle (the first contact angle) of the droplet on the first area, which is a lyophobic area, is small.

Furthermore, a pattern forming method according to the present invention, in which a predetermined pattern is formed by discharging droplets onto a target surface, includes the steps of (i) forming a first area and a second area adjacent to the first area before the droplet is discharged, the first area is lyophobic against droplets, and the second area is lyophilic to droplets and is to be the pattern to be formed, and (ii) discharging the droplets onto the target surface so that a discharging pitch P satisfies the equation (3), the discharging pitch P is a pitch when the droplet is landed.

$$\frac{0.04D^3}{L} \le P \le \frac{0.4D^3}{L} \quad (3)$$

where, P is a discharging pitch (µm), D is a droplet diameter (µm), and L is a water attracting line width (µm).

With the above arrangement, by setting the droplet discharging pitch P with respect to the droplet diameter and the pattern width to fulfill the equation (3), it is possible to realize a pattern which is more even in a line width and a line thickness.

In the case in which a predetermined wiring pattern is formed with droplets which include wiring materials, a wiring pattern, which has less nonuniformity of a line width and a line thickness and has low resistance and small wiring difference in level, can be formed with high throughput.

In this way, by setting the droplet discharging pitch to fulfill the equation (3), it becomes possible to minimize the number of discharged droplets, and also it becomes possible to decrease a tact time and prolong an operating life of a droplet discharging mechanism (inkjet head).

In addition, it is possible to arrange such that uninterrupted patterns are formed by unifying droplets discretely landed onto the target surface.

In this arrangement, since it becomes possible to minimize the number of discharged droplets, it becomes possible to decrease a tact time and prolong an operating life of a droplet discharging mechanism.

An inkjet head may be used for discharging the above droplets.

In this arrangement, a multi-purpose inkjet head which is used for a printer can be used as a droplet discharging mechanism. Thus, it is possible to produce, at a low cost, an apparatus for forming patterns.

The above first area and second area are so formed as to be substantially flat.

In this case, "substantially flat" indicates a state that a difference in level between the first area and the second area is very small as compared with a pattern thickness to be formed. By doing this, it is not necessary to form banks to make apparent difference of affinity to droplets between the first area and the second area. Therefore, the number of processes for a pattern forming can be reduced.

The droplets can contain electrically conductive particles.

In this case, since a pattern, which is formed by discharging droplets, becomes a wiring pattern, the wiring pattern, which has no nonuniformity of a line width and a line thickness, can be realized. Moreover, by decreasing the number of discharged droplets, the droplets do not overlap with each other on a substrate. In this way, it is possible to attain more uniform wiring thickness, that is, uniform wiring resistance. As a result, it is possible to obtain satisfactory wiring characteristics.

The above second area can be a line-shaped pattern.

In this case, a wiring forming can be realized by forming in a line shape. Plus, a high wiring density can be realized by forming the line pattern with an especially narrow width. Further, when applied in wiring formation for a liquid crystal panel, a gate/source/drain wiring should have the line shape. Especially, to improve panel brightness, it is preferable that the line width is narrow because the gate/source/drain wiring is made of a metal.

Additional objects, features, and strengths of the present invention will be made clear by the description below.

Further, the advantages of the present invention will be evident from the following explanation in reference to the drawings.

BRIEF DESCRIPTION OF DRAWINGS

FIG. 1(a) is a side view of a pattern formation substrate of the present invention.

FIG. 1(b) is a plan view of the pattern formation substrate of the present invention.

BEST MODE FOR CARRYING OUT THE INVENTION

The present invention is explained further in detail by embodiments and comparative examples. However, the present invention is not limited to them.

(First Embodiment)

One embodiment of the present invention is explained below. Note that, what is explained in the present embodiment is a pattern forming method of a gate wiring of a TFT (Thin Film Transistor) in a manufacturing process of a liquid crystal panel.

First of all, a pattern forming apparatus for realizing a pattern forming method of the present invention is explained below.

Figure 5:
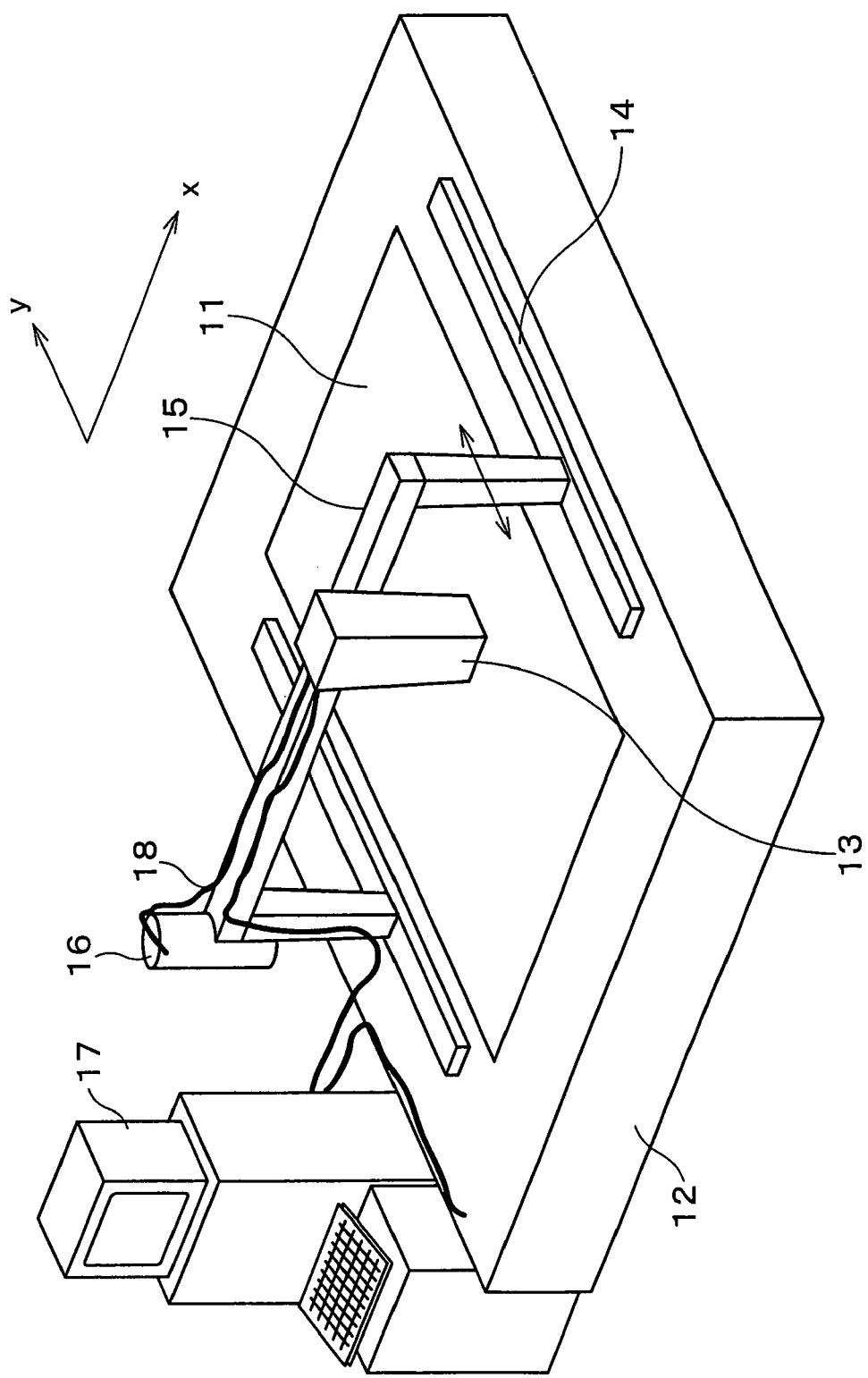
FIG. 5 is a schematic perspective diagram of a pattern forming apparatus for use in a pattern forming method of the present invention.

As illustrated in FIG. 5, the pattern forming apparatus according to the present invention includes a stage 12 on which a substrate 11 is to be mounted. On the stage 12, an inkjet head 13, a Y-direction driving section 14, and an X-direction driving section. 15 are provided. The inkjet head 13 is droplet discharging means for jetting out, onto the substrate 11, fluid ink (droplets) including wiring materials. The Y-direction driving section 14 moves the inkjet head 13 in a y direction, and the X-direction driving section 15 moves the inkjet head 13 move in the x direction.

Moreover, the above pattern forming apparatus includes a droplet supplying system 16, a liquid piping 18, and a device control unit 17. The droplet supplying system 16 and the liquid piping 18 supply the droplets to the inkjet head 13, and the device control unit 17 performs various controls, such as controlling discharging of the inkjet head 13, controlling driving of the Y-direction driving section 14 and the X-direction driving section 15, and other control.

The liquid piping 18 is provided between the inkjet head 13 and the droplet supplying system 16, and droplet supply to the inkjet head 13 is controlled by the droplet supplying system 16.

Moreover, signal cables (not illustrated) are provided between the device control unit 17 and the inkjet head 13, between the device control unit 17 and the Y-direction driving section 14, and between the device control unit 17 and the X-direction driving section 15. The device control unit 17 controls discharging of the inkjet head 13 and driving of the Y-direction driving section 14 and the X-direction driving section 15.

More specifically, the device control unit 17 gives (i) wiring pattern information (Positional information for application) of the substrate 11 to the y-direction drive section 14 and the x-direction drive section 15 and (ii) ejection information to a driver (not illustrated) of the inkjet head 13 in a synchronous manner. This enables the droplets to be dropped on any positions of the entire substrate 11.

As the above inkjet head 13, a piezo type or a thermal type is adopted. The piezo type is a type that pushes out liquid (droplets) from a nozzle by instantaneously increasing liquid pressure in an ink bottle by using a piezoid which changes in shape by being supplied with a voltage, and the thermal type is a type that pushes out liquid by bubbles produced in liquid by using a heater attached on a head. Both types of inkjet heads can adjust the diameter of discharged droplets in response to the voltage applied to the piezoid or the voltage applied to the heater.

In the present embodiment, in the above pattern forming apparatus, a piezo driving type inkjet head, which includes a plurality of nozzles whose diameter is 55 µm, is used as the inkjet head 13. The diameter of discharged droplets can be changed between 50 µm and 75 µm by changing a driving voltage waveform.

Next, a method for forming a wiring pattern onto the substrate 11 by using the above pattern forming apparatus is explained below in reference to FIGS. 1(a) and 1(b). FIG. 1(a) is a side view showing a state of a droplet before landing onto a substrate and a droplet after landing onto the substrate, and FIG. 1(b) is a plan view showing a state of the droplet before landing onto the substrate and the droplet after landing onto the substrate.

As illustrated in FIGS. 1(a) and 1(b), a pattern formation substrate in accordance with the present embodiment is prepared by forming, on the substrate 11, a water attracting line (the first area) 6, which acts as a wiring pattern, and a water repelling area (the second area). A droplet 8 whose diameter D is larger than a line width L of the water attracting line 6 is discharged onto the water attracting line 6, and the droplet 8 fits within the water attracting line 6 by a change of an energy state that the droplet 8 has. Specifically, in the case in which the diameter D of the droplet 8 is larger than the line width L of the water attracting line 6, that part of the droplet 8, which lands on the water repelling area 7, is repelled by the water repelling area 7. Thus, the droplet 8 is gathered up within the water attracting line 6.

Note that, the surface of the substrate 11 is substantially flat since the water attracting line 6 and the water repelling area 7 are realized by chemical process, which will be described later. This can reduce the number of manufacturing steps as compared with the conventional art in which a wiring pattern is formed by forming banks.

By using the above pattern formation substrate, all droplets are gathered up within wiring patterns even if droplets each having a larger diameter than the width of a wiring pattern are used. Therefore, a wiring pattern can be formed with a small number of droplets. Further, if the number of discharged droplets is small, it becomes possible to reduce a tact time and prolong an operating life of the inkjet head.

Figure 2:
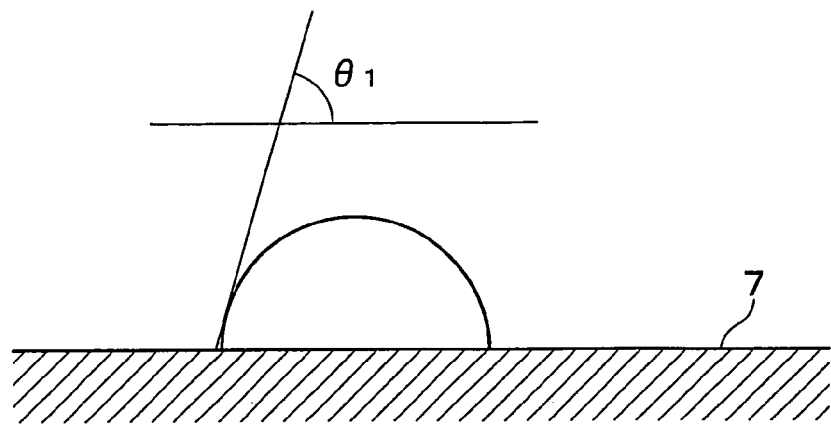
FIG. 2(a) is a diagram for explaining a water repelling property of a droplet.
FIG. 2(b) is a diagram for explaining a water attracting property of the droplet.
Figure 2:
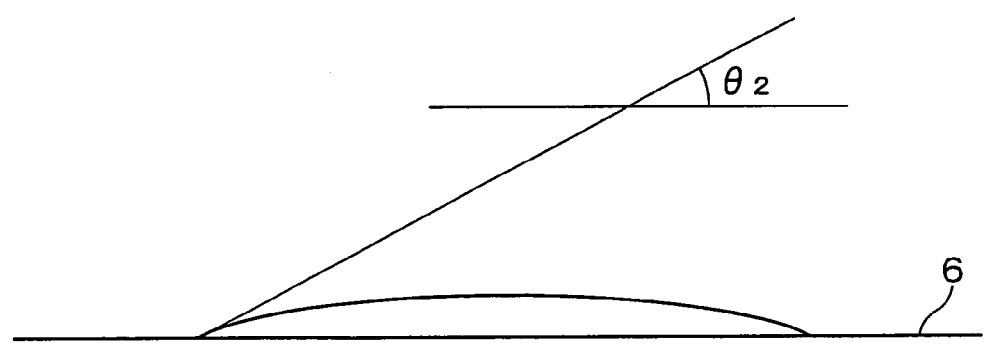

First, the following discusses a case in which the droplet 8 whose diameter is D is dropped onto the water attracting line 6 whose line width is L, the water attracting line 6 sandwiched by the water repelling area 7, as illustrated in FIG. 1(*a*). $\theta_1$ is a contact angle when the droplet 8 lands on the water repelling area 7 as illustrated in FIG. 2(*a*), and $\theta_2$ is another contact angle when the droplet 8 lands on the water attracting line 6 which is a water attracting area. When the droplet 8 lands on the water attracting line 6 of the line width L sandwiched between the water repelling areas 7, a contact angle is $\theta_c(\theta_1 > \theta_c > \theta_2)$. Moreover, where $\gamma$ is a surface energy of the droplet 8, an energy $\Delta W$, which is consumed in response to the change of the droplet 8 while a radius of the discharged droplet 8 is reduced by x and the droplet 8 spreads along the water attracting line 6, is approximately calculated by the equation below:

$$\Delta W = 2D\gamma(\cos\theta_2 - \cos\theta_1)x$$

Where $\Delta S$ is an increased amount of a surface area in response to the change, a surface energy $\gamma\Delta S$ of the droplet 8, which increases in response to the change in shape, is approximately calculated by the equation below:

$$\gamma\Delta S = \gamma(D-L)Dx/L.$$

Therefore, the total energy $\Delta E$, which is a sum of the above two, can be shown by the equation below:

$$\Delta E = \gamma\{D-L-2L(\cos\theta_2 - \cos\theta_1)\}Dx/L$$

Here, when $D-L-2L(\cos\theta_2 - \cos\theta_1) > 0$, that is, when $L < D/\{1+2(\cos\theta_2-\cos\theta_1)\}$, the droplet 8 do not change in shape since $\Delta E$ increases monotonously in relation to the change in shape of the droplet 8.

On the other hand, when $D-L-2L(\cos\theta_2 - \cos\theta_1) < 0$, that is, when $L > D/\{1+2(\cos\theta_2-\cos\theta_1)\}$, the droplet 8 keeps changing in shape until all droplets fit within the water attracting line 6 because $\Delta E$ decreases monotonously in relation to the change in shape of the droplet 8.

For example, when the second contact angle $\theta_2$ is 0 degree and the first contact angle $\theta_1$ is 90 degrees, D<3L. Therefore, a wiring pattern can be appropriately formed even if a droplet, whose diameter is up to three times as large as a line width of the water attracting line, is used. In other words, in this case, a wiring whose line width is 1/3 of the diameter of the droplet can be formed.

Moreover, when the second contact angle $\theta_2$ is 0 degree and the first contact angle $\theta_1$ is 180 degrees, D<5L. Therefore, a wiring pattern can be appropriately formed even if a droplet, whose diameter is up to five times as large as a line width of the water attracting line, is used. In other words, in this case, a wiring whose line width is 1/5 of the diameter of the droplet can be formed.

Accordingly, by adjusting four parameters ($\theta_1$, $\theta_2$, D, L) included in the above equation (1) to fulfill the equation (1), it is possible to attain an appropriate relationship between the droplet diameter D and the line width L of a wiring pattern. For example, if a droplet diameter D is constant, the first contact angle $\theta_1$ and the second contact angle $\theta_2$ are adjusted to obtain a required line width L of a wiring pattern.

Here, a concrete example of a wiring pattern formation is explained below.

Figure 3:
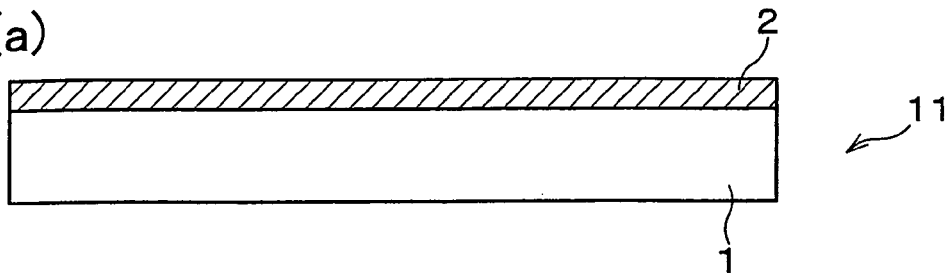
FIGS. 3(a) to 3(d) are diagrams illustrating steps of forming a water attracting area and a water repelling area.
Figure 3:
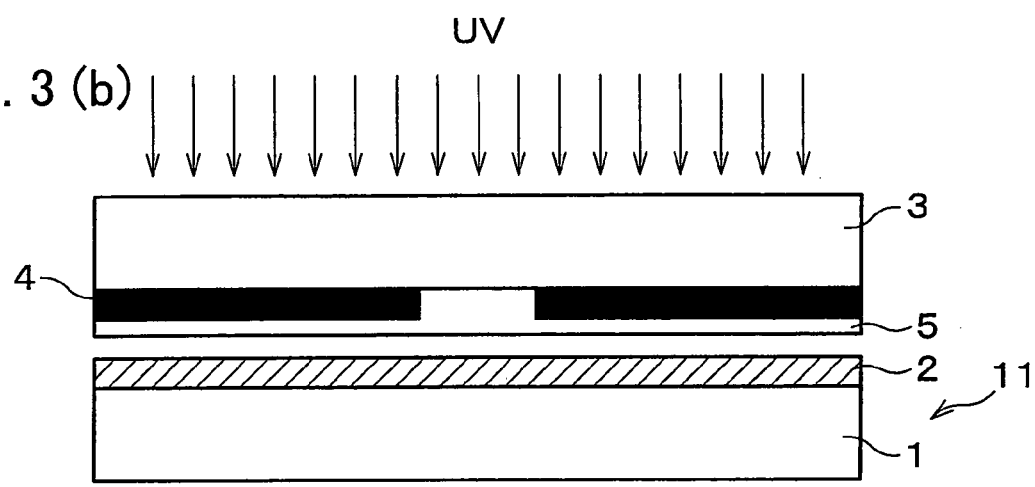
Figure 3:
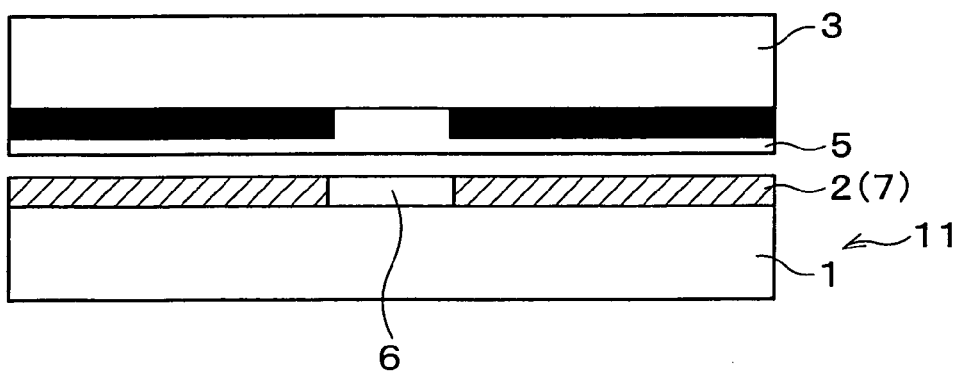
Figure 3:
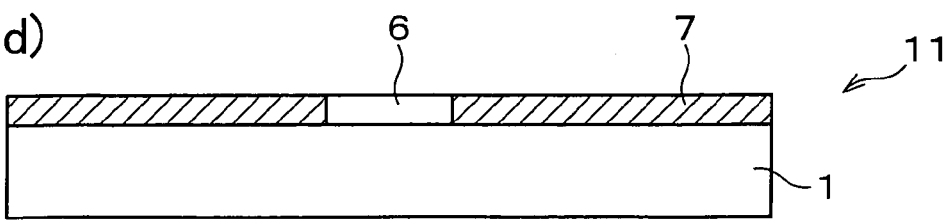

First, a surface modifying process onto the substrate 11, which is performed before forming a wiring pattern, is explained below in reference to FIGS. 3(*a*) to 3(*d*). FIGS. 3(*a*) to 3(*d*) are diagrams illustrating respective steps of the surface modifying process for the substrate 11 before the wirings are formed.

As illustrated in FIG. 3(*a*), by using a spin coat method, a wettability variable layer 2 prepared from a silane coupling agent or the like material is formed by coating a glass substrate 1 with the silane coupling agent or the like material, and drying the silane coupling agent or the like material on the glass substrate 1. Note that, in the present embodiment, as the wettability variable layer 2, a ZONYL FSN (Product Name: provided by Dupont-TORAY Co. Ltd.) is used, which is a fluorochemical nonionic surfactant which had been mixed with isopropyl alcohol.

Next, as illustrated in FIG. 3(*b*), UV exposure is performed through a photo mask 3 on which a mask pattern 4 constituted by chromium or the like and a photocatalyst layer 5 constituted by titanium oxide or the like are formed. Note that, in the present embodiment, the photocatalyst layer 5 is formed by applying a mixture of a material in which a titanium dioxide particle element is dispersed, and ethanol by using the spin coat method, and then subjecting the mixture to a heating treatment of 150° C. Moreover, this exposure is performed with a mercury lamp (wavelength: 365 nm) for two minutes at illumination intensity of 70 mW/cm$^2$.

As a result, as illustrated in FIGS. 3(*c*) and 3(*d*), wettability is improved at a portion that is exposed to UV, thereby forming the water attracting line 6. Note that, the width of the water attracting line 6 formed in the present embodiment is set to be 50 µm.

At this point, the areas except for the water attracting line 6 become the water repelling area 7. In this way, a water attracting/water repelling pattern is formed on the substrate 11 as a wiring pattern.

Then, a gate wiring is formed by dropping a gate wiring material, by using the above pattern forming apparatus, onto the substrate 11 on which the water attracting/water repelling patterns are formed.

A liquid wiring material (droplets), which was used for forming the wiring, is prepared by dispersing Ag particles in mixture solvent of water, ethanol and diethylene glycol. A viscosity was adjusted to be about 10 cP beforehand. As illustrated in FIG. 2(*a*), the first contact angle $\theta_1$ of the droplet on the water repelling area 7, which had been obtained by the above process, was 80 degrees, and as illustrated in FIG. 2(*b*), the second contact angle $\theta_2$ of the droplet on the water attracting line 6, which had been obtained by the above process, was 10 degrees.

By using the above pattern forming apparatus, the droplet 8 is dropped as illustrated in FIG. 1(*a*) onto the substrate 11 on which water attracting/water repelling patterns are formed. When the discharged droplet diameter D is 75 µm, the discharged droplet 8 forms a line shape along the water attracting line 6 as illustrated in FIG. 1(*b*). Note that, the landing position of the droplet 8 is a center of the water attracting line 6.

Let the first contact angle $\theta_1$=80 degrees and the second contact angle $\theta_2$=10 degrees in the above equation (1), then:

$$D \leq 2.62L.$$

This shows that it is possible to form a line even when the droplet diameter D is up to 2.62 times as large as the water attracting line width L. That is, this indicates that a line whose line width of 1/2.62 (≈0.38) times of the droplet diameter D can be formed.

Table 1 below shows results when the above droplets were dropped, in the same condition as above, onto the water attracting lines 6 which had different widths respectively.

TABLE 1

| | LINE WIDTH (μm) | | | |
| --- | --- | --- | --- | --- |
| | 75 | 50 | 30 | 20 |
| RESULT | ○ | ○ | ○ | X |

○: possible to form lines,
X: impossible to form lines

As shown in Table 1, it is impossible to form lines if the line width is 20 μm. When the line width is 20 μm, 20/75 (≈0.27), which is smaller than 0.38 mentioned above. Therefore, the above equation (1) cannot be fulfilled in this case, thereby making it possible to form lines.

Next, Table 2 below shows results when droplets, which had different diameters respectively, were dropped onto the water attracting lines 6 which had different widths respectively. Note that, another inkjet head was used for the droplet diameter D of 35 μm.

TABLE 2

| | LINE WIDTH (μm) | | | |
| --- | --- | --- | --- | --- |
| | 30 | 20 | 15 | 10 |
| DIAMETER: 65 μm | ○ | X | X | X |
| DIAMETER: 50 μm | ○ | ○ | X | X |
| DIAMETER: 35 μm | ○ | ○ | ○ | X |

○: possible to form lines,
X: impossible to form lines

As shown in Table 2, again, it was proved that, when the equation (1) is not fulfilled, it is impossible to form lines.

Here, the relationship between the droplet diameter D and the discharging pitch is explained below.

The pattern forming method, the gate wiring forming method, the pattern forming apparatus and the inkjet head 13 was the same as the above example. In addition, a liquid wiring material (droplet 8), which was used for forming wirings, was made by dispersing Ag particles in water, and the viscosity was adjusted to be about 5 cP beforehand. In this case, as illustrated in FIG. 2(*a*), the first contact angle $\theta_1$ of the droplet 8 on the water repelling area 7 was 100 degrees, and as illustrated in FIG. 2(*b*), the second contact angle $\theta_2$ of the droplet 8 on the water attracting line 6 was 10 degrees.

By using the above pattern forming apparatus, the droplet 8 is dropped as illustrated in FIG. 1(*a*) onto the substrate 11 on which the water attracting/water repelling pattern is formed. Note that, the landing position of the droplet 8 is the center of the water attracting line 6.

Table 3 below shows results when an ink material (droplets 8), whose Ag concentration was 10 vol %, was dropped, with various droplet diameters, onto the water attracting line whose width was 25 μm. And the thickness of the ink material on the water attracting line was set to be 0.3 μm. A head was replaced when the droplet diameter D was from 25 μm to 45 μm.

TABLE 3

| | DISTANCE FROM BORDER BETWEEN WATER ATTRACTING AND WATER REPELLING (μm) | | | |
| --- | --- | --- | --- | --- |
| | 40 | 50 | 100 | 110 |
| DIAMETER: 75 μm | ○ | ○ | ○ | X |
| DIAMETER: 35 μm | ○ | X | X | X |

○: possible to form lines,
X: impossible to form lines

As shown in the result, it becomes possible to form lines by fulfilling the equation (1). Moreover, the bigger the discharged droplet diameter D is, the wider the discharging pitch can be used. As a result, decreasing a tact time and prolonging an operating life of a head can be attained.

Figure 4:
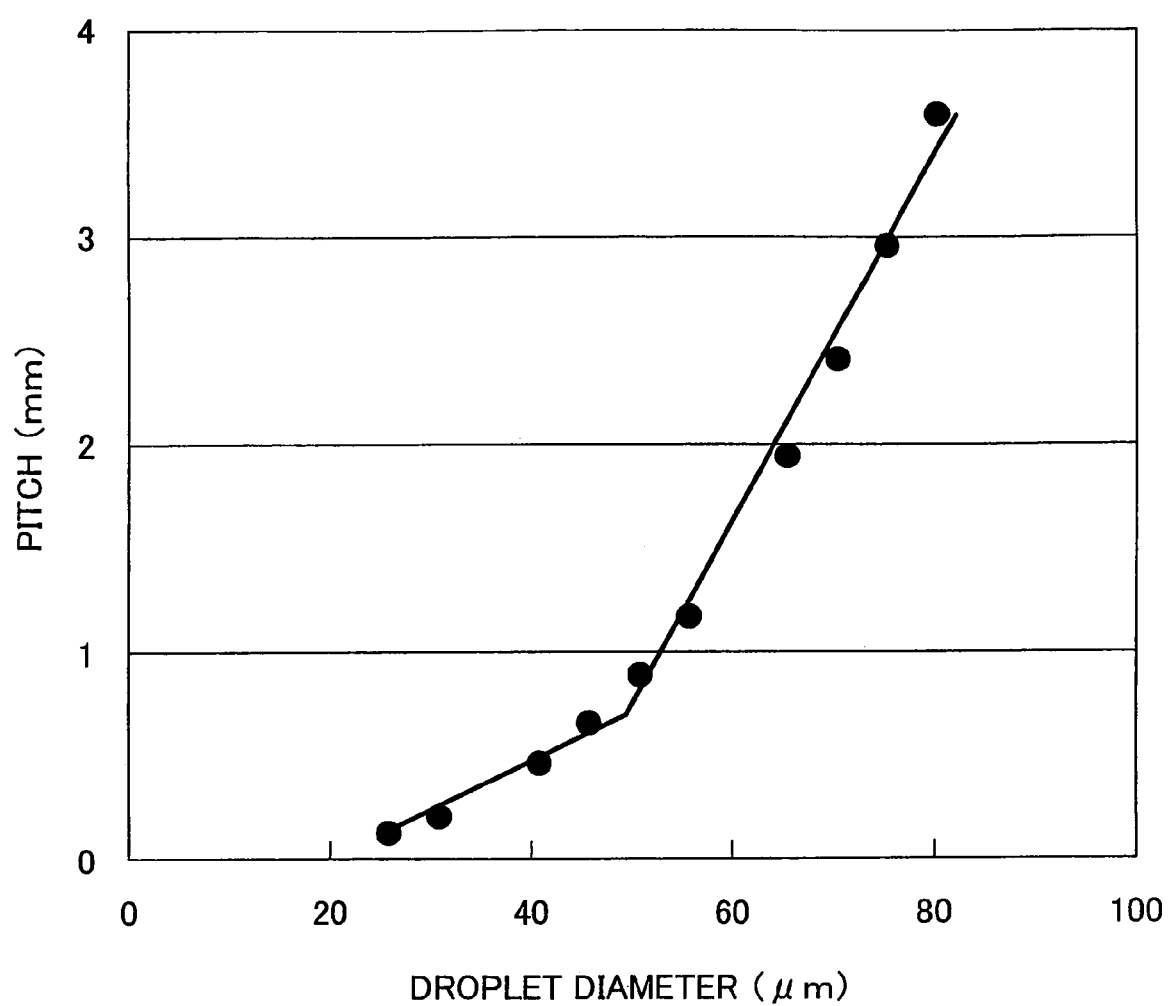
FIG. 4 is a graph illustrating a relation between a droplet diameter and a pitch.

The results in Table 3 are plotted in FIG. 4. The graph of FIG. 4 shows that, because pitches can be dramatically wider by using the droplet diameter D of 50 μm or more, it is preferable to set the equation below for decreasing a tact time and prolonging an operating life of a head:

$$2L \leq D \leq L\{1+2(\cos\theta_2 - \cos\theta_1)\}.$$

Further, the graph of FIG. 4 shows that, when a droplet diameter is more than 54 μm, it is possible to have a pitch 10 times wider as compared with when a droplet diameter is the same as a line width, whereby the tact time can be decreased to 1/10, and the operating life of a head can be prolonged by 10 times.

Therefore, to decrease a tact time and to prolong an operating life of a head, it is more preferable to set the equation as below:

$$2.15L \leq D \leq L\{1+2(\cos\theta_2 - \cos\theta_1)\}.$$

From this, it is found that it is possible to discharge the droplet with a large diameter and a wide pitch by setting to fulfill, $D \leq L\{1+2(\cos\theta_2 - \cos\theta_1)\}$, preferably, $2L \leq D \leq L\{1+2(\cos\theta_2 - \cos\theta_1)\}$, more preferably, $2.15L \leq D \leq L\{1+2(\cos\theta_2 - \cos\theta_1)\}$. Because of this, decreasing a tact time and prolonging an operating life of head can be secured.

That is, the droplets 8 are discretely landed on the water attracting lines 6 on the substrate 11, and each of the droplets 8 is connected with each other to form a continuous pattern. In this way, since it becomes possible to minimize the number of droplets 8 to discharge, it becomes possible to decrease a tact time and prolong an operating life of a droplet discharging mechanism (an inkjet head).

Moreover, when the pitch of discharging droplets is set to be wide to secure decreasing a tact time and prolonging an operating life of a head, there is the case in which, when the line width to be formed is partially narrow, the droplets do not fit within the line. In this case, in response to the line width which needs to be formed, the diameter of discharged droplets is changed by controlling a driving waveform of a head. As a result, regardless of the line width, it is possible to form line of any width with a satisfactory tact time and a satisfactory operating life of a head.

An example of changing a discharged droplet diameter in response to a line width as such is explained in the second embodiment below.

(Second Embodiment)

Another embodiment of the present invention is explained below. Note that, a pattern forming apparatus as shown in the first embodiment is used in the present embodiment so that it will not be explained here.

Also in the present embodiment, a gate wiring pattern forming method of TFT liquid crystal display panel is explained.

Figure 6:
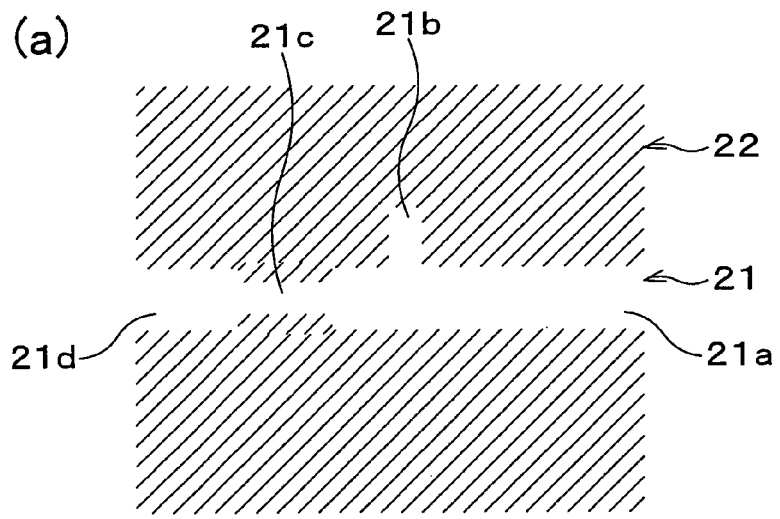
FIGS. 6(a) to 6(c) are diagrams illustrating another pattern forming method of the present invention.
Figure 6:
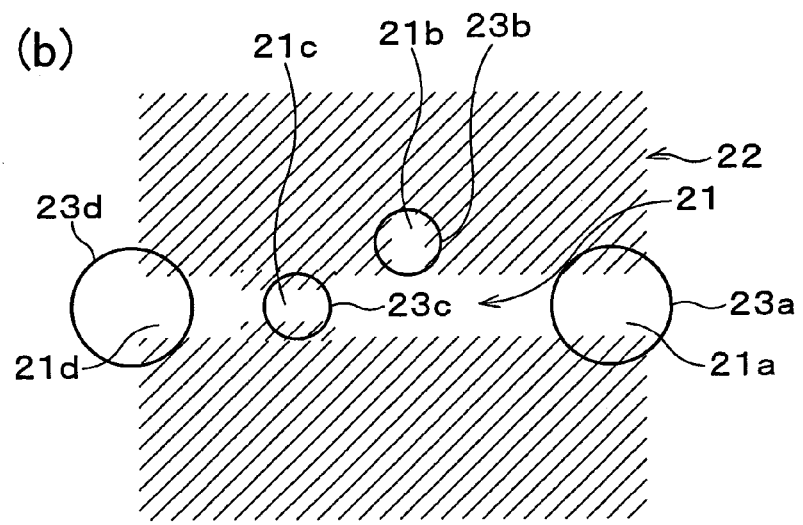
Figure 6:
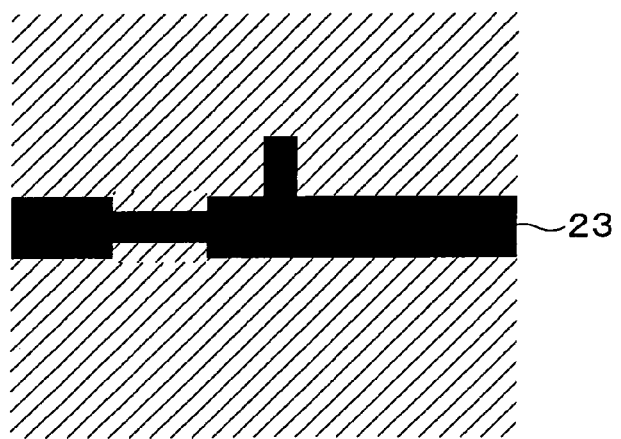

FIG. 6(a) illustrates a gate wiring pattern used in the present embodiment. In this gate wiring pattern, a water attracting/water repelling pattern is formed by a water attracting line 21 and a water repelling area 22, and the line width of the water attracting line 21 is not constant and is partially narrow. Specifically, the water attracting line 21 has a water attracting line 21a through a water attracting line 21d whose widths are respectively different. Each of the widths of the water attracting line 21b and the water attracting line 21c, which are narrower than that of the other lines, is 20 μm, and each of the widths of the other lines (the water attracting line 21a and the water attracting line 21d) is 30 μm. This water attracting/water repelling pattern is formed in the same way as in the first embodiment.

Next, using an inkjet method, a gate wiring is formed by dropping gate wiring materials onto a substrate on which water attracting/water repelling patterns are formed. A pattern forming apparatus and an inkjet head 13, which are used here, are the same as those used in the first embodiment, and a diameter of each of the discharged droplets can be changed from 50 μm to 75 μm.

In addition, a liquid wiring material (droplets) used here is the same as those used in the first embodiment, and the first contact angle $\theta_1$ of the droplet on the water repelling area 22 was 80 degrees, and the second contact angle $\theta_2$ of the droplet on the water attracting line 21 was 10 degrees.

And, by using an inkjet head, the droplets 23 on the water attracting line 21 are discharged as illustrated in FIG. 6(b). The droplets each having a diameter of 75 μm are discharged for patterns whose line width is 30 μm, and the droplets each having a diameter of 50 μm are discharged for patterns whose line width is 20 μm. By changing the droplet diameter in response to the line width as above, it is possible to place the droplet 23 on the entire water attracting line 21 (FIG. 6(c)).

Note that, when droplets each having a diameter of 75 μm were discharged onto a pattern whose line width was 20 μm, the wiring material did not fit within the pattern. When droplets each having a diameter of 50 μm were discharged onto an entire pattern, it is possible to form lines, but the tact time increases as compared with the case in which droplets each having a diameter of 75 μm were discharged for a pattern whose line width is 30 μm. Therefore, it is preferable that a droplet diameter be changed in relation to each line width to fulfill the equation:

$$2L \leq D \leq L\{1+2(\cos \theta_2 - \cos \theta_1)\},$$

more preferably, $$2.15L \leq D \leq L\{1+2(\cos \theta_2 - \cos \theta_1)\}.$$

By changing the droplet diameter, it becomes possible to put droplets into patterns whose line width varies. Furthermore, a satisfactory tact time and a satisfactory operating life of a head can be obtained.

In each embodiment described above, droplets are discharged onto the center of a water attracting line. To discharge droplets onto the center of the water attracting line, it is necessary to use a high-precision inkjet head. However, the high-precision inkjet head is so expensive that there is a possibility of total price increase of a pattern forming apparatus.

At this point, what is explained in the third embodiment is a pattern forming method which can form lines on water attracting lines even if droplets are not discharged onto the center of water attracting lines.

(Third Embodiment)

Still another embodiment of the present invention is explained below. Note that, as in the case of the first embodiment, the present embodiment discusses an example in which wiring lines are formed by using a water attracting/water repelling pattern which is formed by water attracting lines 6 and water repelling areas 7. The water attracting lines 6 and the water repelling areas 7 are formed by modifying the surface of the substrate 11 by the surface modifying processing method illustrated in FIGS. 3(a) and 3(d).

Figure 7:
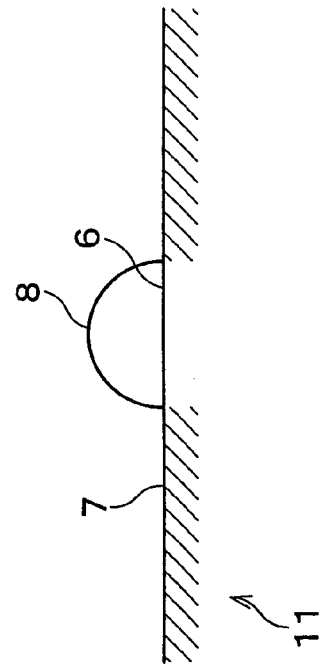
FIGS. 7(a) and 7(b) are diagrams illustrating yet another pattern forming method of the present invention.
Figure 7:
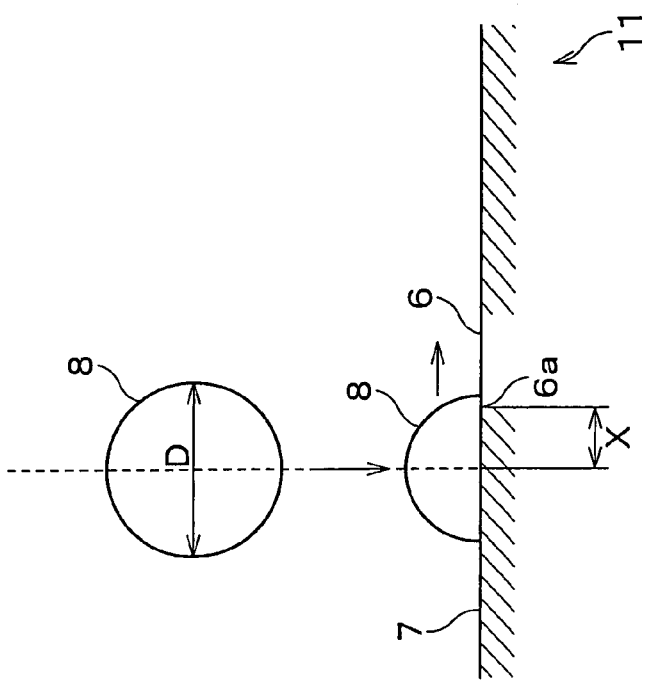

A pattern forming method in accordance with the present embodiment is a method for moving the droplet 8 to within the water attracting lines 6 as illustrated in FIG. 7(b) when the droplet 8 did not land on the center of the water attracting lines 6 on the substrate 11 as illustrated in FIG. 7(a).

The inventors found out that, when the droplet 8 landed on the substrate 11, the entire droplet 8 could move from the water repelling area 7 into the water attracting line 6 as long as the droplet partially lands on the water attracting line 6. That is, if the distance from a border, which is between the water attracting line 6 and the water repelling area 7, to a landing position of a droplet 8 is shorter than a radius of a circular contact face of the landed droplet 8, the entire droplet 8 can move from the water repelling area 7 into the water attracting line 6, $$R_2 = R_1 \times 3\sqrt{\{4/(2-3\cos \theta_1 - \cos^3 \theta_1)\}},$$

where the radius of a droplet before landing is $R_1$, the contact angle of a droplet in a water repelling area is $\theta_1$ and a radius of a circular contact face when the droplet 8 landed is $R_2$. When the above $R_2$ is converted into the droplet diameter D, the equation (2) below is obtained:

$$X \leq \sqrt[3]{\frac{4}{2-3\cos\theta_1 + \cos^3\theta_1}} \cdot \frac{D}{2}. \quad (2)$$

where X is a distance between a border of water attracting/water repelling patterns and a center of a landing droplet, D is a droplet diameter, and $\theta_1$ is a contact angle of ink in a water repelling area.

That is, when a pattern (which is not limited to a line shape) is formed, using a water attracting/water repelling base pattern, by an inkjet method, it is possible to move, as illustrated in FIG. 7(b), the droplet from the water repelling area 7 by setting, as illustrated in FIG. 7(a), a landing position of a droplet 8 between the water attracting/water repelling border 6a and a range defined by the equation (2) below. Therefore, even when the landing position of the droplet 8 is not on the water attracting line 6, it is possible to move the droplet to a predetermined position. Therefore, even when a low-precision inkjet head is used, a pattern can be formed precisely. As a result, it is possible to attain a low manufacturing cost of a pattern forming apparatus.

The droplet 8 can move in a wider range when the droplet 8 is larger as long as a shape of a water attracting/water repelling pattern permits and the contact angle of the droplet 8 with respect to a water repelling 7 area is smaller.

$$X \le \sqrt[3]{\frac{4}{2-3\cos\theta_1+\cos^3\theta_1}} \cdot \frac{D}{2} \quad (2)$$

where X is a distance between a border of water attracting/water repelling patterns and a center of landing droplet, D is a droplet diameter, and $\theta_1$ is a contact angle of ink in a water repelling area.

Table 4 below shows results obtained with different landing positions of droplets when the water attracting line width was 50 μm. Note that, a liquid wiring material (droplets), which was used for forming wirings, was made by dispersing Ag particles in a mixed solvent of water, ethanol and diethylene glycol, and the viscosity was adjusted to be about 10 cP beforehand. As illustrated in FIG. 2(a), the first contact angle $\theta_1$ of the droplet 8 on the water repelling area 7, which was obtained by the above process, was 80 degrees, and as illustrated in FIG. 2(b), the second contact angle $\theta_2$ of the droplet 8 on the water attracting line 6, which was obtained by the above process, was 10 degrees.

TABLE 4

| | DIAMETER D (μm) | | | | | | | | | | |
|---|---|---|---|---|---|---|---|---|---|---|---|
| | 25 | 30 | 40 | 45 | 50 | 55 | 65 | 70 | 75 | 80 | 85 |
| PITCH (mm) | 0.11 | 0.19 | 0.45 | 0.64 | 0.87 | 1.16 | 1.92 | 2.39 | 2.94 | 3.57 | X |

X: impossible to form lines

It was found from Table 4 that, when the droplet whose diameter is 75 μm is used, it is possible to form lines as long as the droplet 8 is landed within a distance of 100 μm from the water attracting/water repelling border 6a, whereas, when the droplet whose diameter is 35 μm is used, it is possible to form lines if the distance between the water attracting/water repelling border 6a and the landing position is up to 40 μm.

As above, the droplet discharging test with an inkjet head confirmed that the entire droplet can move onto the water attracting line as long as at least a part of a contact face of the droplet is on the water attracting line. Thereupon, by setting the droplet radius and the landing position beforehand as defined in the above equation (2), a pattern can be formed precisely even when a low-precision inkjet head is used.

(Fourth Embodiment)

Yet another embodiment of the present invention is explained below. Note that, as is the case with the first embodiment, what is explained in the present embodiment is an example that wiring lines are formed by using a water attracting/water repelling pattern which is formed with water attracting lines 6 and water repelling areas 7. The water attracting lines 6 and the water repelling areas 7 are formed by modifying the surface of the substrate 11 by the surface modifying processing method illustrated in FIG. 3(a) to 3(d).

Figure 8:
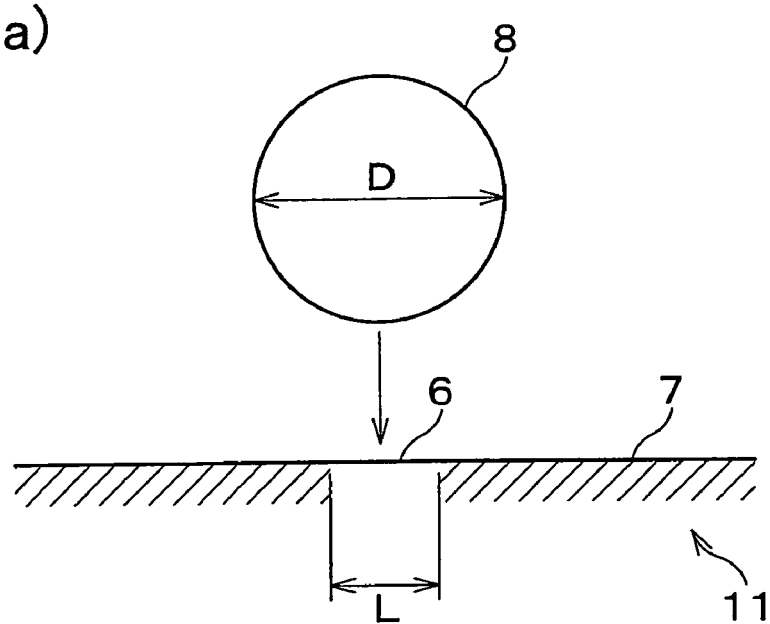
FIGS. 8(a) and 8(b) are diagrams illustrating still another pattern forming method of the present invention.
Figure 8:
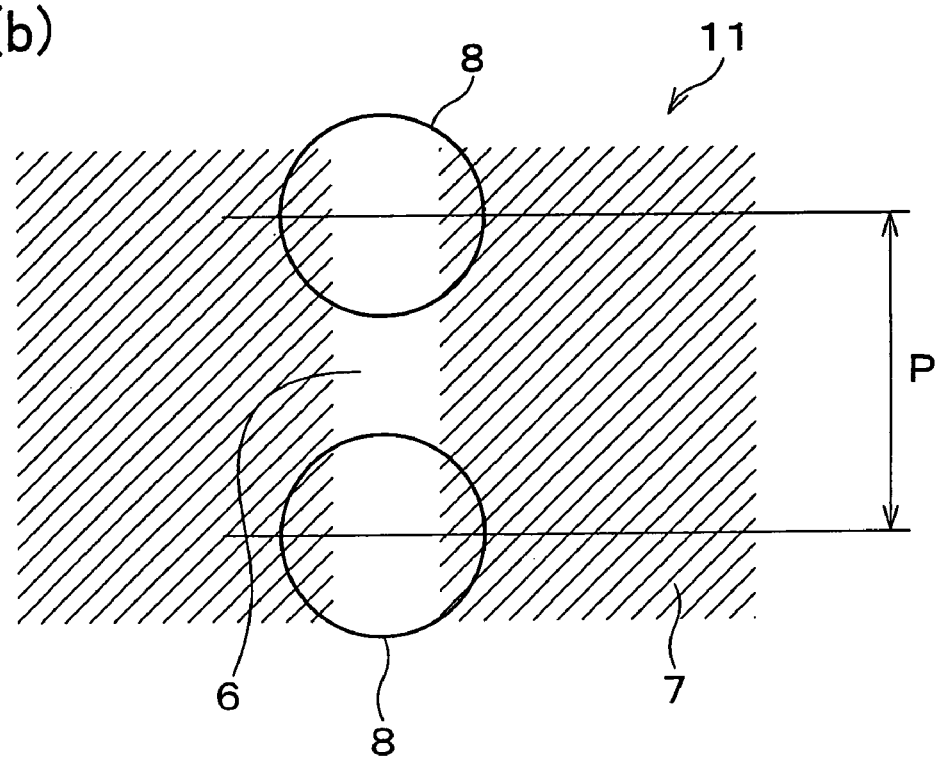

The pattern forming method in accordance with the present embodiment is explained below in reference to FIGS. 8(a) and 8(b). FIG. 8(a) is a side view of the droplet 8 which is just before landing, and FIG. 12(b) is a plan diagram of the droplet 8 which is just before landing.

According to the pattern forming method of the present invention, by setting a discharging pitch to fulfill an equation (3) below, with respect to a discharging droplet diameter and a water attracting line width on which a wiring is to be formed, it is possible to form, with high throughput, a conductor pattern which is more even in line width and thickness, and has low resistance and small wiring difference in level.

$$\frac{0.04D^3}{L} \le P \le \frac{0.4D^3}{L} \quad (3)$$

where P is a discharging pitch (μm), D is a droplet diameter (μm), and L is a water attracting line width (μm).

The above equation (3) can be obtained as below.

Here, what is utilized in the pattern forming method in accordance with the present embodiment is that a thickness of wirings can be controlled by controlling a droplet diameter D and a discharging pitch P in the case in which a pattern having a water attracting line width L is formed on a substrate beforehand.

Therefore, to obtain the above equation (3), it is necessary to obtain the values below by calculation.

(i) A total volume V of droplets, which can be obtained from the droplet diameter D and the discharging pitch P (ii) A thickness of a wiring, which can be calculated from the total volume V of droplets and the water attracting line width L (iii) A discharging pitch P, which can be calculated by a condition of the thickness suitable for a pattern forming Where P is the above discharging pitch (μm), the dot number per 1 μm is 1/P (dot/μm).

In addition, where the droplet diameter is D, the total volume $V=\pi D^3/6$. Therefore, the total volume per 1 μm is:

$$1/P \times \pi D^3/6 = \pi D^3/6P (\mu m^3).$$

Where the line width is L (μm), the height of a droplet is $\pi D^3/6LP$. Where Ag concentration is b (vol %), the height t (μm) of Ag is obtained by the following equation:

$$t = \pi b D^3/600LP.$$

If a droplet changes in shape, the discharging pitch $P=(\pi b/600t) \times (D^3/L)$.

The inventors found that, by setting πb/600t no less than 0.04 and no more than 0.4 with respect to the discharging droplet and the water attracting line width which forms lines, a wiring pattern, whose line width and thickness has less nonuniformity and which has low resistance and small wiring difference in level, can be formed with high throughput.

Table 5 shows the result of a wiring forming when, in the above pattern forming method, droplets each having a diameter of 75 μm are discharged onto a water attracting line whose width is 50 μm with various landing pitches. Numerical values in the table show a thickness of the film in which the wiring was formed by subsectioning, after an inkjet process, the liquid wiring material to a heat of 250° C. for ten minutes to dry off solvent and to bake materials. Note that, the liquid wiring material used here contained Ag particles in a ratio of 10% by volume.

TABLE 5

| | LANDING PITCH (μm) | | | | |
|---|---|---|---|---|---|
| | 350 | 400 | 1500 | 3000 | 3500 |
| RESULT (THICKNESS: μm) | Δ (1.47) | ◯ (1.10) | ◯ (0.30) | ◯ (0.15) | X (0.13) |

◯: good wiring characteristics
Δ: no good since wiring difference in level is too big
X: no good since wiring resistance is too big From Table 5, it was found out that the appropriate wiring pattern could not be obtained when the landing pitch was as narrow as 350 μm, or as wide as 3500 μm.

Likewise, Table 6 below shows results of a wiring forming when, in the above pattern forming method, droplets each having a diameter of 50 μm were discharged with various landing pitches onto a water attracting line whose width was 20 μm. Numerical values in the table show a thickness of the film in which wiring was formed by subjecting, after an inkjet process, the liquid wiring material to a heat of 250° C. for ten minutes to dry off solvent and to bake materials. Note that, the liquid wiring material used here contained Ag particles in a ratio of 10% by volume.

TABLE 6

| | LANDING PITCH (μm) | | | | |
|---|---|---|---|---|---|
| | 200 | 250 | 1000 | 2300 | 2600 |
| RESULT (THICKNESS: μm) | Δ (1.64) | ◯ (1.31) | ◯ (0.33) | ◯ (0.14) | X (0.13) |

◯: good wiring characteristics
Δ: no good since wiring difference in level is too big
X: no good since wiring resistance is too big From Table 6, it was found out that the appropriate wiring pattern could not be obtained when the landing pitch was as narrow as 200 μm, or as wide as 2600 μm.

These findings show that an appropriate range of a landing pitch is determined in relation to a water attracting line width and a droplet diameter if a droplet material is the same.

In each embodiment described above, a liquid wiring material (droplet) for forming a wiring was prepared by dispersing Ag particles in a mixed solvent of water, ethanol and diethylene glycol. Therefore, "lyophilic" is expressed as "water attracting", and "lyophobic" is expressed as "water repelling". However, for example, the solvent of the droplet wiring material may be oil-based not water-based. In this case, "lyophilic" is expressed as "lipophilic", and "lyophobic" is expressed as "oil-repellent".

In addition, each embodiment described above explains the examples using an inkjet method using an inkjet head as a mechanism for discharging droplets onto a substrate which is a pattern formation substrate. However, the present invention is not limited to this, provided that the mechanism can control the droplet diameter and discharge the droplets.

Moreover, an inkjet head is not limited to a piezo type, and may be of a thermal type such as a bubble jet (registered mark).

Furthermore, it is acceptable if the second area (water attracting line 6) formed on the substrate 11 has a line shape. In this case, the line shape does not have to be lath-shaped as shown in each embodiment described above, but may be meandering or tapered. Moreover, the line can be a combination of these shapes. Further, a contour of the line is not necessarily rectilinear, but can include curves and zigzags.

In this way, a wiring forming can be realized by forming the water attracting line 6 in the line shape. Plus, a high wiring density can be realized by forming the line pattern with an especially narrow width. Further, when applied in wiring formation for a liquid crystal panel, it is essential that a gate/source/drain wiring have the line shape. Especially, to improve panel brightness, it is preferable that the line width be narrow because the gate/source/drain wiring is made of a metal.

As described above, a pattern formation substrate of the present invention is so arranged that a predetermined pattern is formed by discharging droplets onto a target surface, and the pattern formation substrate is formed to fulfill the equation (1) below when part of the droplet lands on the first area and the other part of the droplet lands on the second area. A contact angle of the first area, when the above droplet lands on, is the first contact angle, and a contact angle of the second area, which lies adjacent to the first area, is the second contact angle which is smaller than the first contact angle:

$$D \leq L \times \{1 + 2(\cos\theta_2 - \cos\theta_1)\} \quad (1)$$

where D is the droplet diameter, L is the pattern width, $\theta_1$ is the first contact angle, and $\theta_2$ is the second contact angle.

According to the above arrangement, because the second contact angle is smaller than the first contact angle, the second area is more lyophilic than the first area. With this arrangement, when a droplet lands so that the droplet is on the first area and the other part is on the second area, the part of the droplet on the first area will move to the second area (pattern) which is more lyophilic than the first area.

Furthermore, by setting the droplet diameter, the wiring pattern width, the first contact angle, and the second contact angle so as to fulfill the equation (1), droplets will be gathered into the second area even if the droplet diameter is larger than the pattern width.

By using droplets each having a diameter larger than a pattern width, the number of discharged droplets can be reduced as compared with when droplets each having a diameter equal to or smaller than a pattern width, is used.

By reducing the number of discharged droplets as above, it is possible to prevent an increase of a tact time and shortening of an operating life of a droplet discharging mechanism, such as an inkjet head.

Further, it may be so arranged that the first contact angle is set so that the first area becomes a lyophobic area which is lyophobic against droplets, and the second contact angle is set so that the second area becomes a lyophilic area which is lyophilic to droplets.

In this case, the first area becomes a lyophobic area which is lyophobic against droplets and the second area becomes a lyophilic area which is lyophilic to droplets. Therefore, when part of the droplet lands on the first area and the other part of the droplet lands on the second area, the droplet is repelled by the first area which is a lyophobic area, and the droplet spreads along the shape of the second area which is a lyophilic area. That is, the droplet, which is repelled by the first area, flows to the second area, and it spreads along the second area (pattern) with droplets which land on the second area, and forms wirings.

Therefore, by arranging that an area that is not to be part of the pattern, that is, the first area, is lyophobic against droplets, it is possible to repel the landed droplets and to make droplets flow to the second area.

If the first area is a lyophobic area and the second area is a lyophilic area as above described, a difference between the first contact angle and the second contact angle becomes large, and the right side of the equation (1) becomes large. Here, the larger right side of the equation (1) indicates that it is possible to use droplets of a further larger droplet diameter in relation to a wiring pattern width.

Therefore, the number of discharging droplets can be further decreased by arranging such the droplets are greater in droplet diameter in relation to a wiring pattern width. As a result, it becomes possible to decrease a tact time and prolong an operating life of a droplet discharging mechanism such as an inkjet head.

Moreover, the pattern forming method according to the present invention, in which a predetermined pattern is formed by discharging droplets onto a target surface, includes the steps of (i) forming a first area and a second area adjacent to the first area before the droplet is discharged, the first area is lyophobic against droplets, and the second area is lyophilic to droplets and being to be the pattern to be formed, and (ii) discharging the droplets onto the target surface so that a distance x satisfy the equation 2, the distance x is a distance from a border between the first and the second areas, to a center of a landed droplet.

$$X \leq \sqrt[3]{\frac{4}{2 - 3\cos\theta_1 + \cos^3\theta_1}} \cdot \frac{D}{2} \qquad (2)$$

where X is a distance between a border of water attracting/water repelling patterns and a center of a landing droplet, D is a droplet diameter, and $\theta_1$ is a contact angle of ink in a water repelling area.

Therefore, the droplets land onto a target surface so that the distance X, which is the distance between the border of the first area and the second area and the center of landing droplet, can fulfill the equation (2). In this way, droplets, which land on the first area which is a lyophobic area, can move to the second area which is a lyophilic area. That is, it is possible to move droplets to the second area even if the center of landing droplets is not on the second area.

With this arrangement, even when a low-precision droplet discharging mechanism such as an inkjet head is used to discharge droplets onto the substrate, a pattern can be formed precisely because the droplets can surely be flown to the second area which is to be a pattern.

Therefore, the arrangement makes it possible to reduce the cost of an apparatus for forming a pattern.

Furthermore, the pattern forming method according to the present invention, in which a predetermined pattern is formed by discharging droplets onto a target surface, includes the steps of (i) forming a first area and a second area adjacent to the first area before the droplet is discharged, the first area is lyophobic against droplets, and the second area is lyophilic to droplets and is to be the pattern to be formed, and (ii) discharging the droplets onto the target surface so that a discharging pitch P satisfy the equation (3), the discharging pitch P is a pitch when the droplet is landed.

$$\frac{0.04D^3}{L} \leq P \leq \frac{0.4D^3}{L} \qquad (3)$$

where P is a discharging pitch (µm), D is a droplet diameter (µm), and L is a water attracting line width (µm).

Therefore, by setting the droplet discharging pitch P with respect to the droplet diameter and the pattern width to fulfill the equation (3), it is possible to form the pattern with more evenness in a line width and a line thickness.

When the droplet contains a wiring material and a wiring pattern is formed as a predetermined pattern, it is possible to form, with high throughput, the wiring pattern which has less nonuniformity of a line width and a line thickness and has low resistance and small wiring difference in level.

In this way, by setting the droplet discharging pitch to fulfill the equation (3), it becomes possible to minimize the number of discharged droplets required for forming the pattern, and also it becomes possible to attempt to decrease a tact time and prolong an operating life of a droplet discharging mechanism (inkjet head).

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

INDUSTRIAL APPLICABILITY

A pattern formation substrate and a pattern forming method of the present invention are in a field that a wiring pattern on a substrate is formed by an inkjet technology, and especially, can be suitably used in a field that needs prolonging inkjet heads and reducing the manufacturing cost.

The invention claimed is:

1. A pattern formation substrate on which a predetermined pattern is formed by discharging droplets onto a target surface thereof, the pattern formation substrate comprising:
a first surface containing the target surface comprising a first area and a second area forming a pattern comprising a line of width L, the first area being formed such that a droplet thereon exhibits a first contact angle between the droplet and the first area, the second area being formed such that a droplet thereon exhibits a second contact angle between the droplet and the second area, wherein;
when the droplet is landed onto the target surface such that part of the droplet is in the first area, and part of the droplet is in the second area, which is adjacent to the first area, the second contact angle is smaller than the first contact angle, and equation (1) is satisfied, $$D \leq L \times \{1 + 2(\cos\theta_2 - \cos\theta_1)\} \qquad (1)$$

where D is a droplet diameter, $\theta_1$ is a first contact angle, and $\theta_2$ is a second contact angle.

2. A pattern forming method, comprising the steps of:
providing a pattern forming substrate comprising:

a first surface containing the target surface comprising a first area and a second area forming a pattern comprising a line of width L, the first area being formed such that a droplet thereon exhibits a first contact angle between the droplet and the first area, the second area being formed such that a droplet thereon exhibits a second contact angle between the droplet and the second area, wherein;

when the droplet is landed onto the target surface such that part of the droplet is in the first area, and part of the droplet is in the second area, which is adjacent to the first area, the second contact angle is smaller than the first contact angle, and equation (1) is satisfied, $$D < L \times \{1+2(\cos\theta_2 - \cos\theta_1)\} \quad (1)$$

where D is a droplet diameter, $\theta_1$ is a first contact angle, and $\theta_2$ is a second contact angle;

landing droplets on the pattern forming substrate wherein one part of a droplet can land on the first area and another part of the droplet can land on the area on said pattern formation substrate, thereby forming a pattern with the droplets.

3. The pattern forming method as set forth in claim 2, wherein the first contact angle is set so that the first area becomes a lyophobic area which is lyophobic against the droplets, and a second contact angle is set so that the second area becomes a lyophilic area which is lyophilic to the droplets.

4. A pattern forming method in which a predetermined pattern is formed by discharging droplets onto a target surface, comprising the steps of:

forming a first area and a second area adjacent to the first area before the droplet is discharged, the first area being lyophobic against droplets, and the second area being lyophilic to droplets and being to be the pattern to be formed; and discharging the droplets onto the target surface so that a distance x satisfy the equation 2, the distance x being a distance from a border between the first and the second areas, to a center of a landed droplet, $$X \leq \sqrt[3]{\frac{4}{2 - 3\cos\theta_1 + \cos^3\theta_1}} \cdot \frac{D}{2} \quad (2)$$

where X is a distance between border of water attracting/water repelling patterns and a center of a landing droplet, D is a droplet diameter, and $\theta_1$ is a contact angle of an ink in a water repelling area.

5. A pattern forming method in which a predetermined pattern is formed by discharging droplets onto a target surface, comprising the steps of:

forming a first area and a second area adjacent to the first area before the droplet is discharged, the first area being lyophobic against droplets, and the second area being lyophilic to droplets and being to be the pattern to be formed; and discharging the droplets onto the target surface so that a discharging pitch P satisfy the equation (3), the discharging pitch P being a pitch when the droplet is landed, $$\frac{0.04D^3}{L} \leq P \leq \frac{0.4D^3}{L} \quad (3)$$

where P is a discharging pitch (μm), D is a droplet diameter (μm), L is a water attracting line width (μm).

6. A pattern forming method as set forth in any one of claims 2 through 5, wherein uninterrupted patterns are formed by unifying droplets discretely landed onto the target surface.

7. A pattern forming method as set forth in any one of claims 2 through 5, wherein an inkjet head is used for discharging the droplets.

8. A pattern forming method as set forth in any one of claims 2 through 5, wherein the first area and the second area are so formed as to be substantially flat.

9. A pattern forming method as set forth in any one of claims 2 through 5, wherein the droplets contain electrically conductive particles.

10. A pattern forming method as set forth in any one of claims 2 through 5, wherein the second area is a line-shaped pattern.

* * * * *